(12) United States Patent
Siau et al.

(10) Patent No.: US 11,670,346 B2
(45) Date of Patent: Jun. 6, 2023

(54) MEMORY CELL PROGRAMMING INCLUDING APPLYING PROGRAMMING PULSES OF DIFFERENT PULSE WIDTHS TO DIFFERENT ACCESS LINES

(71) Applicant: MICRON TECHNOLOGY, INC., Boise, ID (US)

(72) Inventors: Chang H. Siau, Saratoga, CA (US); Michele Piccardi, Cupertino, CA (US); Qui V. Nguyen, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 161 days.

(21) Appl. No.: 17/034,540

(22) Filed: Sep. 28, 2020

(65) Prior Publication Data

US 2022/0068325 A1     Mar. 3, 2022

Related U.S. Application Data

(60) Provisional application No. 63/072,259, filed on Aug. 31, 2020.

(51) Int. Cl.
| | |
|---|---|
| *G11C 16/10* | (2006.01) |
| *G11C 7/10* | (2006.01) |
| *G11C 7/22* | (2006.01) |
| *G11C 16/34* | (2006.01) |
| *G11C 16/26* | (2006.01) |

(52) U.S. Cl.
CPC .......... *G11C 7/1018* (2013.01); *G11C 7/1096* (2013.01); *G11C 7/222* (2013.01); *G11C 16/10* (2013.01); *G11C 16/26* (2013.01); *G11C 16/3454* (2013.01)

(58) Field of Classification Search
None
See application file for complete search history.

(56) References Cited

U.S. PATENT DOCUMENTS

| | | |
|---|---|---|
| 8,254,180 B2 | 8/2012 | Hoei et al. |
| 2020/0090755 A1* | 3/2020 | Ogura ................. G11C 8/14 |

* cited by examiner

*Primary Examiner* — Alfredo Bermudez Lozada
(74) *Attorney, Agent, or Firm* — Dicke, Billig & Czaja, PLLC

(57) ABSTRACT

Memory having an array of memory cells and a plurality of access lines each connected to a respective plurality of memory cells of the array of memory cells might include a controller configured to cause the memory to apply a respective programming pulse having a first target voltage level and a first pulse width to each access line of a first subset of access lines of the plurality of access lines, and apply a respective programming pulse having the first target voltage level and a second pulse width longer than the first pulse width to each access line of a second subset of access lines of the plurality of access lines, wherein each access line of the first subset of access lines is nearer a particular end of the string of series-connected memory cells than each access line of the second subset of access lines.

20 Claims, 10 Drawing Sheets

MEMORY CELL PROGRAMMING INCLUDING APPLYING PROGRAMMING PULSES OF DIFFERENT PULSE WIDTHS TO DIFFERENT ACCESS LINES

This application claims the benefit of U.S. Provisional Application No. 63/072,259, filed on Aug. 31, 2020, hereby incorporated herein in its entirety by reference.

TECHNICAL FIELD

The present disclosure relates generally to integrated circuits, and, in particular, in one or more embodiments, the present disclosure relates to apparatus and methods for programming of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Programming memory cells typically utilizes an iterative process of applying a programming pulse to a memory cell and verifying if that memory cell has reached its desired data state in response to that programming pulse, and repeating that iterative process until that memory cell passes the verification. Before each programming pulse, word lines might be precharged, and after each programming pulse, the word lines might be discharged. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation. Given the iterative nature of programming operations, and the relatively high voltage levels each iteration uses, programming operations can be significant influences on both the speed and power consumption of a memory.

DETAILED DESCRIPTION

Figure 1:
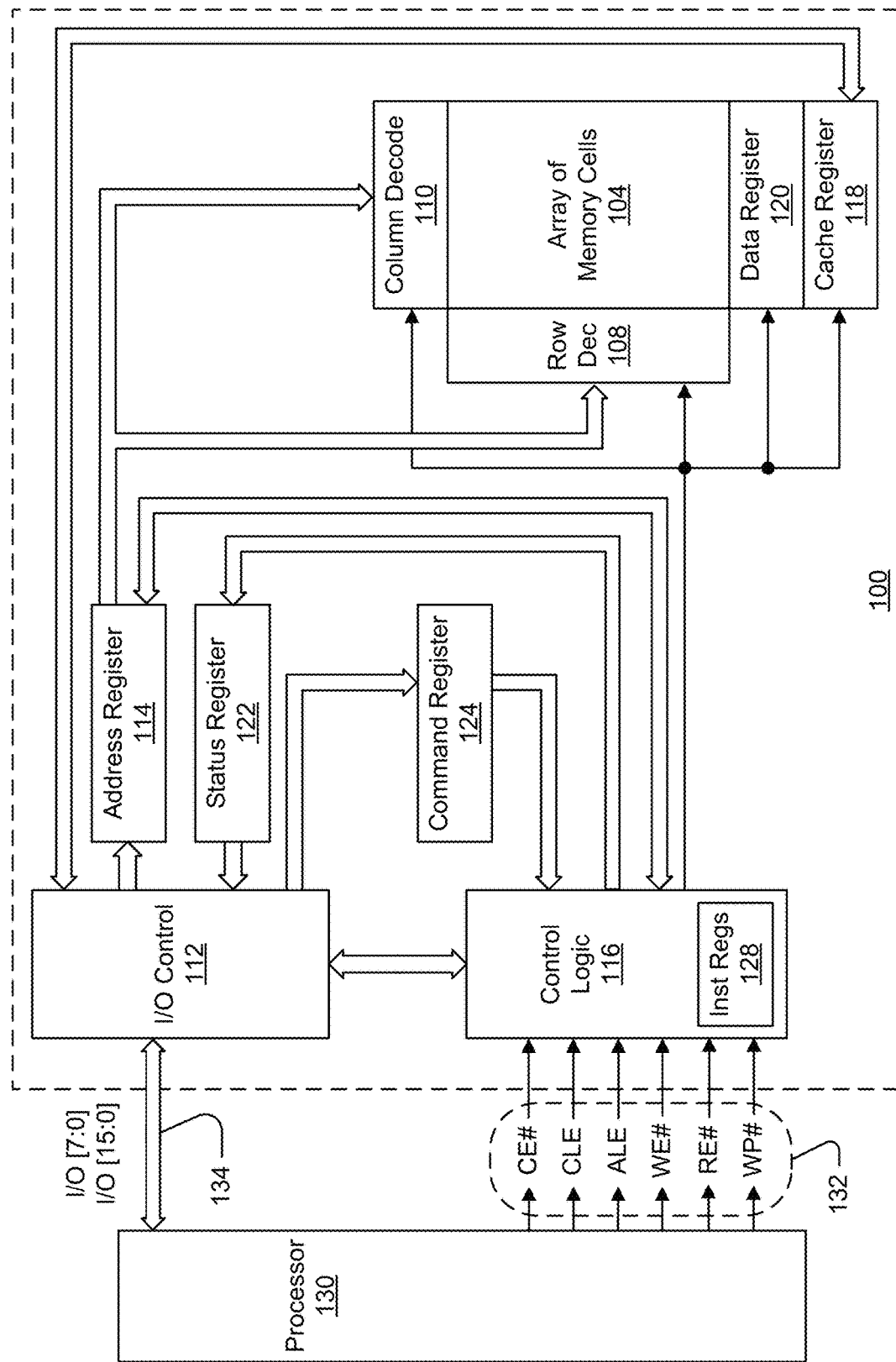
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/ output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
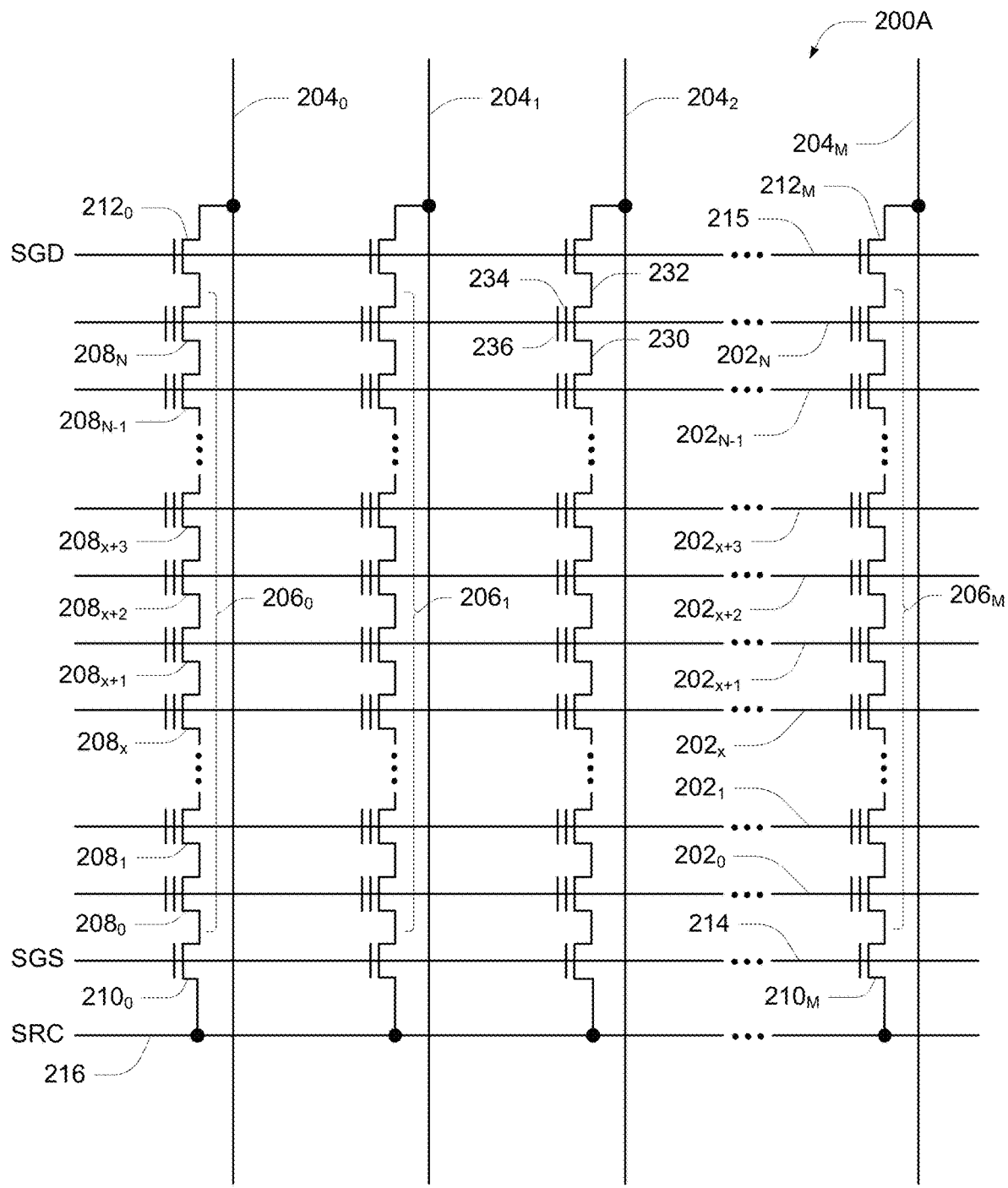
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
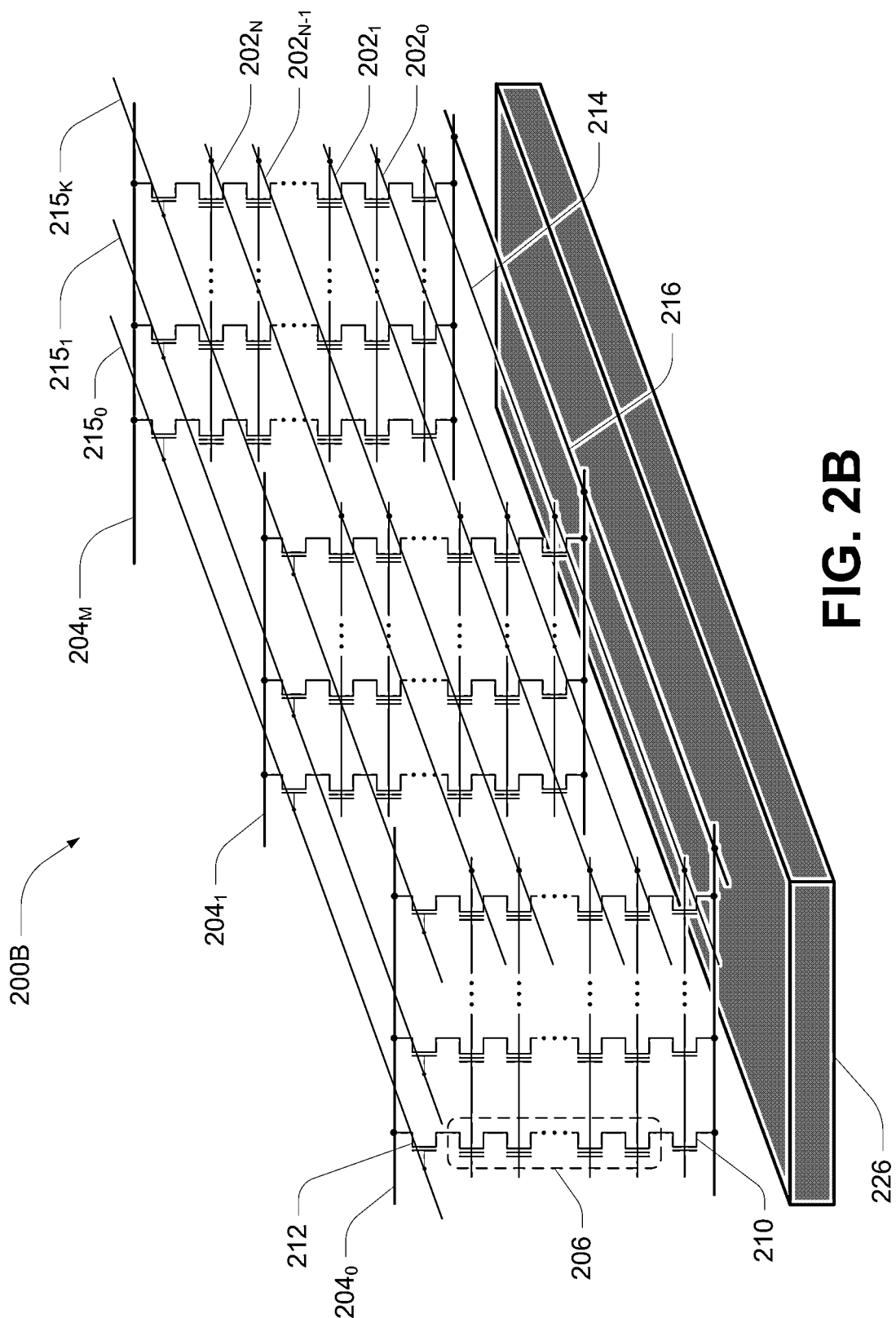

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
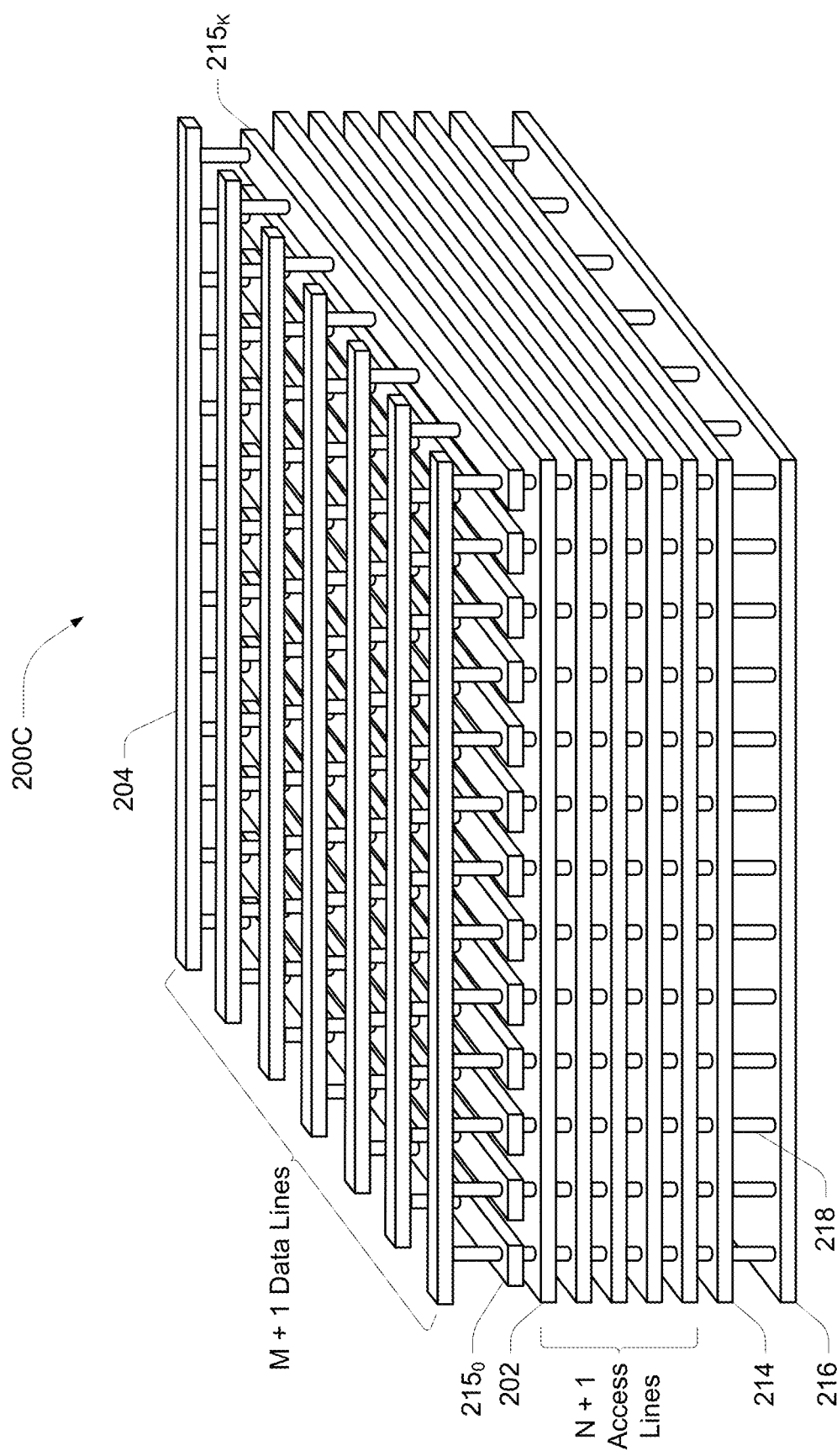
FIG. 2C is a perspective view of elements of a portion of an array of memory cells as could be used in a memory of the type described with reference to FIG. 1.

FIG. 2C is a perspective view of elements of a portion of an array of memory cells 200C as could be used in a memory of the type described with reference to FIG. 1. Like numbered elements in FIG. 2C correspond to the description as provided with respect to FIG. 2A. FIG. 2C provides alternative detail of one example of a three-dimensional NAND memory array structure. The three-dimensional NAND memory array 200C might incorporate vertical structures which may include semiconductor pillars 218 where a portion of a pillar 218 may act as a channel region of the memory cells of NAND strings. The pillars 218 may be each connected to a bit line 204 and to a source 216 in many-to-one relationships. For some embodiments, the pillars 218 might have a hollow core. A select transistor (e.g., drain select transistor) 212 (not identified in FIG. 2C) might be formed at each intersection of a pillar 218 and a select line (e.g., drain select line) 215. A select transistor (e.g., source select transistor) 210 (not identified in FIG. 2C) might be formed at each intersection of a pillar 218 and a select line (e.g., source select line) 214. A memory cell 208 (not identified in FIG. 2C) might be formed at each intersection of a pillar and an access line (e.g., word line) 202. The three-dimensional NAND memory array 200C depicts that the word lines 202 might be formed as conductive plates (e.g., parallel conductive plates), and each word line 202 might be adjacent (e.g., immediately adjacent) at least one other word line 202.

Figure 3B:
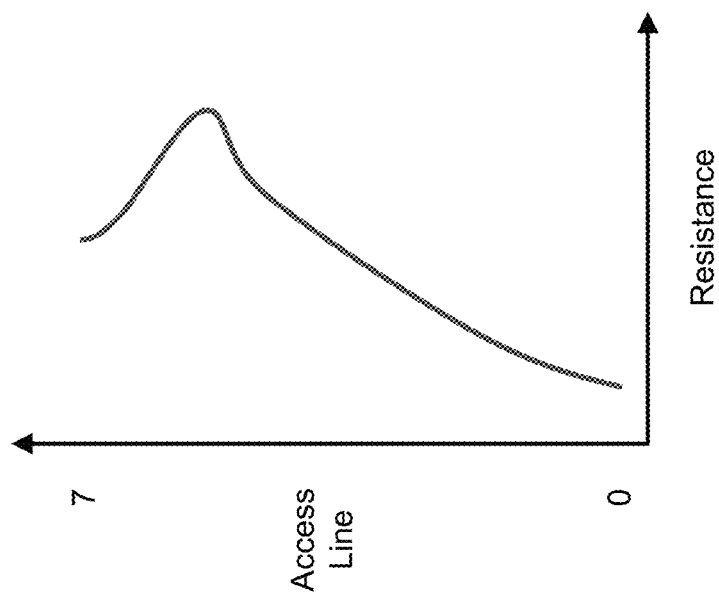
FIG. 3B depicts a graph of a relationship of resistance levels that the access lines of FIG. 3A might have.
Figure 3A:
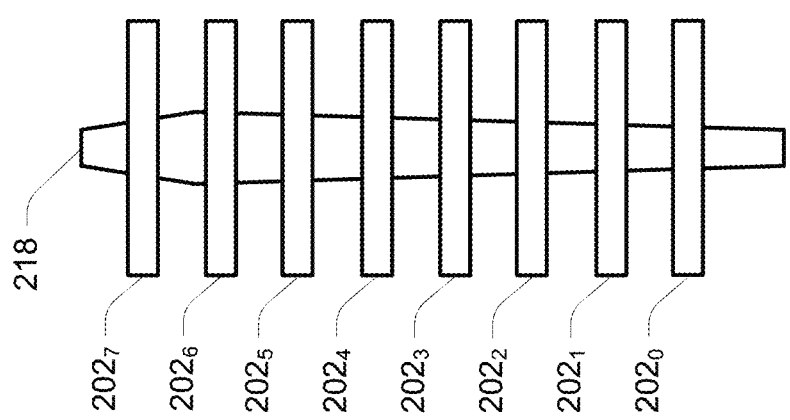
FIG. 3A depicts a portion of a semiconductor pillar having cross-sections of various sizes, and several access lines formed around the pillar in accordance with embodiments.

Although the pillars 218 of FIG. 2C are depicted as cylindrical in nature, typical fabrication techniques might produce pillars 218 having cross-sections of various sizes. For example, while a pillar 218 might be fabricated by forming a via using a circular mask, its resulting shape may not be cylindrical, and might instead have varying diameters along its length. FIG. 3A depicts a portion of a semiconductor pillar 218 having cross-sections of various sizes, and several access lines 202 formed around the pillar 218. The access lines 202 might be conductive plates such as depicted in FIG. 2C. As such, access lines 202 intersecting with the pillar 218 at portions having larger cross-sections might have larger resistances than access lines 202 intersecting with the pillar 218 at portions having smaller cross-sections. In the example of FIG. 3A, the access line $202_6$ might be expected to have a larger resistance than each of the remaining access lines $202_0$-$202_5$ and $202_7$. FIG. 3B depicts a graph of the relationship of the resistance levels that the access lines 202 might have.

Programming typically involves applying one or more programming pulses to a selected word line and thus to the control gates of the row of memory cells connected to the selected word line (e.g., having their control gates connected to the selected word line). Typical programming pulses might start at or near 13V and tend to increase in magnitude for each subsequent programming pulse application. While the program potential (e.g., voltage level of the programming pulse) is applied to the selected word line, an enable voltage, such as a ground potential (e.g., 0V), might be applied to the channels of memory cells selected for programming, i.e., those memory cells for which the programming operation is intended to shift their data state to some higher level. This might result in a charge transfer from the channel to the charge storage structures of these selected memory cells. For example, floating gates are typically charged through direct injection or Fowler-Nordheim tunneling of electrons from the channel to the floating gate, resulting in a threshold voltage typically greater than zero in a programmed state.

An inhibit voltage (e.g., Vcc) is typically applied to bit lines which are selectively connected to a NAND string containing a memory cell that is connected to the selected word line and is not selected for, or no longer selected for, programming. In addition to bit lines selectively connected to memory cells already at their target data state, these unselected bit lines might further include bit lines that are not addressed by the programming operation. For example, a logical page of data might correspond to memory cells connected to a particular word line and selectively connected to some particular subset of the bit lines (e.g., every other bit line), such that the remaining subset of bit lines would be unselected for the programming operation and thus inhibited.

Between the application of one or more programming pulses, a verify operation is typically performed to check each selected memory cell to determine if it has reached its target data state. If a selected memory cell has reached its target data state, e.g., passes the verify operation, it might be inhibited from further programming if there remain other selected memory cells still requiring additional programming pulses to reach their target data states. Following a verify operation, an additional programming pulse might be applied if there are memory cells that have not completed programming, e.g., have failed the verify operation. This process of applying a programming pulse followed by performing a verify operation (e.g., a program-verify phase of a programming operation) typically continues until all the selected memory cells have reached their target data states. If a particular number of programming pulses (e.g., maximum number) have been applied, or a particular voltage level of a programming pulse (e.g., maximum voltage level) has been reached, and one or more selected memory cells still have not completed programming, those memory cells might be marked as defective, for example. Various embodiments seek to reduce a number of these program-verify phases of a programming operation.

Figure 4A:
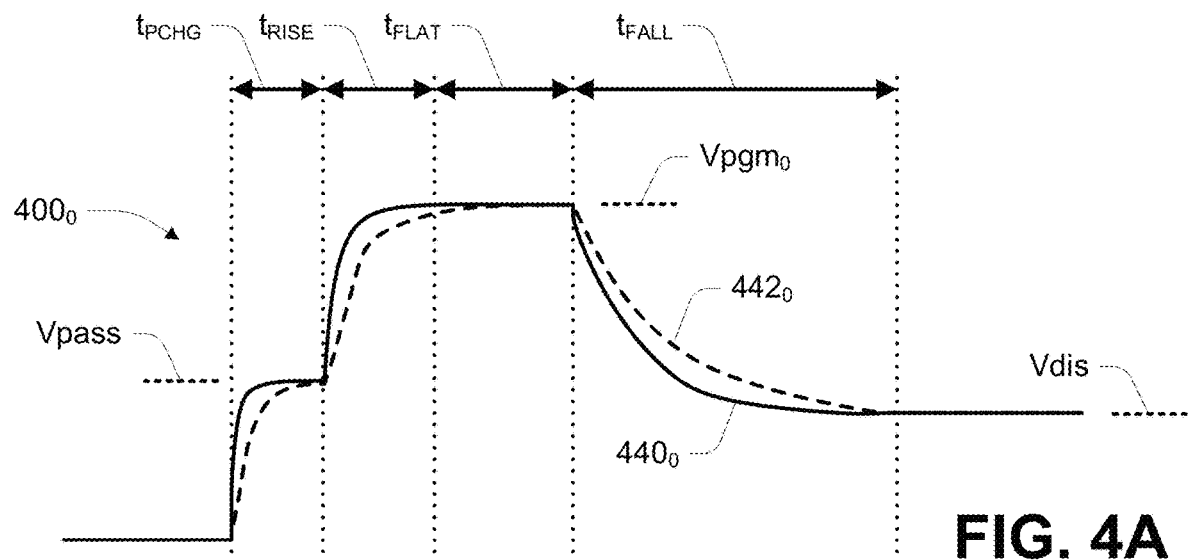
FIGS. 4A and 4B depict timing diagrams of voltage levels of an access line selected for a programming operation during an initial programming pulse and a subsequent, higher, programming pulse for use with embodiments.
Figure 4B:
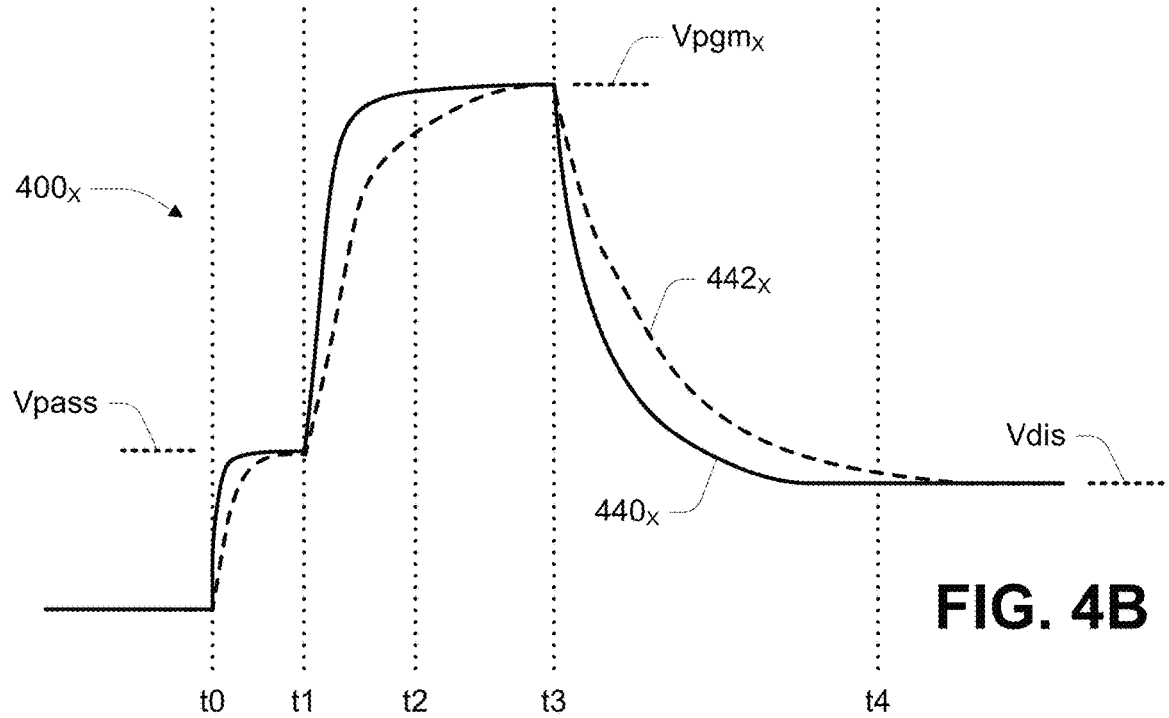

FIGS. 4A and 4B depict timing diagrams of voltage levels of an access line selected for a programming operation during an initial programming pulse $400_0$ and a subsequent, higher, programming pulse $400_X$. The trace $440_0$ of the programming pulse $400_0$ might represent a voltage level of the selected access line at a memory cell, selected for a programming operation, nearest a driver applying the various voltage levels to the selected access line, while the trace $442_0$ of the programming pulse $400_0$ might represent a voltage level of the selected access line at a memory cell, selected for the programming operation, farthest from the driver. Similarly, the trace $440_X$ of the programming pulse $400_X$ might represent a voltage level of the selected access line at the memory cell nearest the driver, while the trace $442_X$ of the programming pulse $400_X$ might represent a voltage level of the selected access line at the memory cell farthest from the driver.

In a typical programming operation, all access lines of a NAND string, including the selected access line, are initially increased to some common voltage level, such as a pass voltage. As such, a first step increase in voltage level for programming pulse $400_0$ is depicted between times t0 and t1 in FIG. 4A, and a first step increase in voltage level for programming pulse $400_X$ is depicted between times t0 and t1 in FIG. 4B, which might be referred to as $t_{PCHG}$. These voltage levels might be the same for both programming pulses. As depicted in FIGS. 4A and 4B, the response of the access line farther from the driver will be slower than the response nearer the driver due to the RC time constant of the access line. As such, traces $440_0$ and $440_X$ reach a desired voltage level, e.g., Vpass, before traces $442_0$ and $442_X$, respectively. In some cases, traces $442_0$ and $442_X$ might not reach Vpass by time t1.

For each programming pulse, the selected access line might then be increased from Vpass toward a programming voltage level, e.g., $Vpgm_0$ for programming pulse $400_0$ and $Vpgm_X$ for programming pulse $400_X$, while the unselected access lines might remain at the Vpass voltage level. The period of time between times t1 and t2, might be referred to as $t_{RISE}$. This period of time might generally be defined as a time necessary to achieve the desired voltage level at the output of the voltage generation system, e.g., a charge pump, and at the beginning of the selected access line for a representative programming voltage level. The desired voltage level might be the programming voltage level, or it might be some intermediate voltage level, e.g., within 1% of the programming voltage level While this period of time might generally be considered to be independent of the RC characteristics of the selected access line, the RC characteristic of the selected access line will affect its own response to the applied voltages. As such, traces $440_0$ and $440_X$ reach or approach their desired programming voltage level, e.g., $Vpgm_0$ and $Vpgm_X$, respectively, before traces $442_0$ and $442_X$, respectively. In addition, at higher voltage levels, these effects may become more pronounced, with trace $442_X$ being farther from its desired programming voltage level $Vpgm_X$ than trace $442_0$ at their respective time t2. Furthermore, if the period of time $t_{RISE}$ is equal for both programming pulses $400_0$ and $400_X$, a period of time sufficient for the trace $440_X$ to attain the desired voltage level may be insufficient for the trace $440_X$ to attain its desired voltage level.

For each programming pulse, the selected access line might then be allowed to maintain, or further approach, its respective programming voltage level between times t2 and t3, which might be referred to as $t_{FLAT}$. In general, this period of time might relate to a period of time deemed sufficient to affect changes (e.g., increases) in threshold voltage of memory cells connected to the selected access line that are enabled for programming. However, as the traces $440_0$ and $440_X$ are generally higher than the traces $442_0$ and $442_X$, respectively, during this period of time, enabled memory cells nearer the driver might be expected to experience more effective changes in their threshold voltages than enabled memory cells farther from the driver. Again, this effect might be more pronounced with reference to the programming pulse $400_X$. The result is that memory cells nearer the driver may program more quickly than memory cells farther from the driver, which might require additional programming pulses for all selected memory cells to attain their desired data states.

For each programming pulse, the selected access line might then be allowed to discharge to some discharge voltage level, e.g., Vdis, between times t3 and t4, which might be referred to as $t_{FALL}$. Because a verify operation (e.g., a sense operation) might be performed following a programming pulse, or a subsequent programming pulse might be applied without performing a verify operation, the discharge voltage level may be near the pass voltage level Vpass.

The following discussion will focus on the time period from time t1 to time t4 of a programming pulse. For this discussion, the voltage generation system might be a charge pump. The following parameters will be referenced:

Vmax=maximum generated voltage of the voltage generation system
Rpmp=resistance level of the voltage generation system
Cpmp=capacitance level of the voltage generation system
Rwl=resistance level of the selected access line
Cwl=capacitance level of the selected access line
Vstart=voltage level at time t1
Vtarget=desired voltage level for a programming pulse
Vdis=desired discharge voltage level
G=approach goal, a percentage of a desired voltage level The period of time $t_{RISE}$ discussed with reference to FIGS. 4A and 4B might be described by Equation 1. This period of time might be dominated by the RC characteristics of the voltage generation system, and may not depend with any significance on the R or C of the access line.

$$t_{RISE}=Rpmp*Cpmp*\ln[(Vmax-Vstart)/(Vmax-Vtarget)] \quad (Eq.\ 1)$$

While the near side of the access line might be deemed to reach the target voltage level Vtarget at time t2, the far side of the access line might be expected to ramp slower and might typically reach an intermediate voltage, e.g., $V_{RISE}$, lower than Vtarget, at time t2 for a given period of time $t_{RISE}$ as described by Equation 2.

$$V_{RISE}=Vstart+(Vmax-Vstart)*[1-\exp(-t_{RISE}/Rwl*Cwl)] \quad (Eq.\ 2)$$

While the value of $t_{RISE}$ might not be expected to be significantly dependent upon the RC characteristics of the access line, it may be dependent upon the target voltage level. For example, an initial programming pulse might have a target voltage level of Vtarget_init_pulse while an Nth programming pulse might have a target voltage level of Vtarget_Nth_pulse, higher than Vtarget_init_pulse. A value for $t_{RISE}$ of the Nth programming pulse, e.g., $t_{RISE(Nth)}$, might be expressed as $t_{RISE(Nth)}=Q_{RISE(Nth)}*t_{RISE(init)}$, where $Q_{RISE(Nth)}$ might be described by Equation 3:

$$Q_{RISE(Nth)}=(\ln[(Vmax-Vstart)/(Vmax-Vtarget\_Nth\_pulse)])/(\ln[(Vmax-Vstart)/(Vmax-Vtarget\_init\_pulse)]) \quad (Eq.\ 3)$$

The period of time $t_{FLAT}$ discussed with reference to FIGS. 4A and 4B might be described by Equation 4. The period of time $t_{FLAT}$ might be defined as the time needed for the access line to reach an intermediate voltage level Vint1, that might be expressed as a goal percentage (e.g., 99%) of the target voltage level Vtarget after the voltage generation system has reached the target voltage level Vtarget, e.g., after $t_{RISE}$. This period of time might be dominated by the RC characteristics of the access line.

$$t_{FLAT}=Rwl*Cwl*\ln[(Vtarget-V_{RISE})/(Vtarget-Vint1)] \quad (Eq.\ 4)$$

The value of $t_{FLAT}$ might be dependent upon the RC characteristics of the access line as well as the target voltage level of a programming pulse. A base value of $t_{FLAT}$, e.g., $t_{FLAT(init)}$ might be based on a particular resistance, e.g., Rdes, and a particular capacitance, e.g., Cdes, of an access line, and the initial target voltage level Vtarget_init_pulse. Accordingly, a value for $t_{FLAT}$ of the Nth programming pulse, e.g., $t_{FLAT(Nth)}$, might be expressed as $t_{FLAT(Nth)}=Q_{FLAT(Nth)}*t_{FLAT(init)}*B_{RC}+Y_{Vtarget}$, where $Q_{FLAT(Nth)}$ might be a multiplier dependent primarily on the relative target voltage levels, $B_{RC}$ might be a multiplier dependent primarily upon relative RC characteristics, and $Y_{Vtarget}$ might be a correction factor dependent primarily upon the relative target voltage levels. The multiplier $B_{RC}$ might have a weak dependence on the relative target voltage levels, which could be lumped into the $Y_{Vtarget}$ parameter by gap analysis. The values of Rdes and Cdes might represent measured or expected values of a particular access line of a block of memory cells, e.g., an access line nearest one end of a string of series-connected memory cells, such as an end nearest a common source of the block of memory cells. The value of Cwl for each access line might also be deemed to be equal to Cdes.

The multiplier $Q_{FLAT(Nth)}$ might be described by Equation 5:

$$Q_{FLAT(Nth)}=(\ln[(Vtarget\_Nth\_pulse-V_{RISE\_Nth\_pulse})/(Vtarget\_Nth\_pulse-Vint1\_Nth\_pulse)])/(\ln[(Vtarget\_init\_pulse-V_{RISE\_init\_pulse})/(Vtarget\_init\_pulse-Vint1\_init\_pulse)]) \quad (Eq.\ 5)$$

The multiplier $B_{RC}$ might be described as a ratio of a value of $t_{FLAT}$ calculated with the Vtarget of a particular programming pulse for the RC characteristics of the access line, e.g., Rwl*Cwl, over a value of $t_{FLAT}$ calculated with that same Vtarget for the particular RC characteristics, e.g., Rdes*Cdes. For example, the multiplier $B_{RC}$ might be calculated for a programming pulse subsequent to the initial programming pulse.

The period of time $t_{FALL}$ discussed with reference to FIGS. 4A and 4B might be described by Equation 6. The period of time $t_{FALL}$ might be defined as the time needed to discharge the access line to an intermediate voltage level Vint2, that might be expressed as a goal percentage (e.g., 101%) of the discharge voltage level Vdis. This period of time might be dominated by the RC characteristics of the access line.

$$t_{FALL}=Rwl*Cwl*\ln[(Vtarget-Vdis)/(Vint2-Vdis)] \quad (Eq.\ 6)$$

The value of $t_{FALL}$ might be dependent upon the RC characteristics of the access line as well as the target voltage level of a programming pulse. A base value of $t_{FALL}$, e.g., $t_{FALL(init)}$ might be based on the particular resistance, e.g., Rdes, and the particular capacitance, e.g., Cdes, of an access line, and the initial target voltage level Vtarget_init_pulse. Accordingly, a value for $t_{FALL}$ of the Nth programming pulse, e.g., $t_{FALL(Nth)}$, might be expressed as $t_{FALL(Nth)}=Q_{FALL(Nth)}*t_{FALL(init)}*C_{RC}$ where $Q_{FALL(Nth)}$ might be a multiplier dependent primarily on the relative target voltage levels, and $C_{RC}$ might be a multiplier dependent primarily upon relative RC characteristics.

The multiplier $Q_{FALL(Nth)}$ might be described by Equation 7:

$$Q_{FALL(Nth)}=(\ln[(Vtarget\_Nth\_pulse-V_{RISE\_Nth\_pulse})/(Vtarget\_Nth\_pulse-Vint1\_Nth\_pulse)])/(\ln[(Vtarget\_init\_pulse-V_{RISE\_init\_pulse})/(Vtarget\_init\_pulse-Vint1\_init\_pulse)]) \quad (Eq.\ 7)$$

The multiplier $C_{RC}$ might be described as a ratio of the RC characteristics of the access line, e.g., Rwl*Cwl, over the particular RC characteristics, e.g., Rdes*Cdes.

Figure 5:
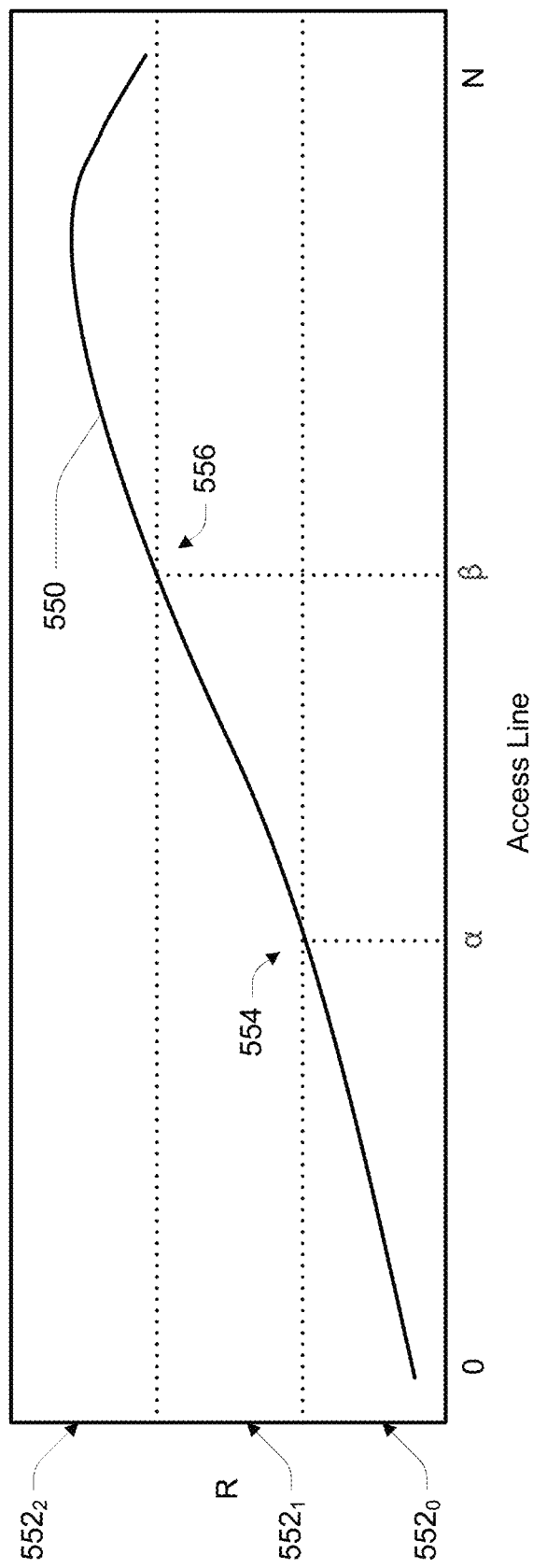
FIG. 5 depicts a graph of resistance values that might occur for N+1 access lines of a block of memory cells in accordance with embodiments.

FIG. 5 depicts a graph of resistance values that might occur for N+1 access lines of a block of memory cells. Such a graph might be determined for a block of memory cells in response to a determination of resistive characteristics that might be determined experimentally, empirically or through simulation in known manners. See, e.g., U.S. patent application Ser. No. 16/877,710 to Dan Xu et al., titled "APPARATUS AND METHODS FOR DETERMINATION OF CAPACITIVE AND RESISTIVE CHARACTERISTICS OF ACCESS LINES," and U.S. Provisional Patent Application Ser. No. 62/954,057 to Dan Xu et al. titled "MEMORY ARRAY STRUCTURES AND METHODS FOR DETERMINATION OF RESISTIVE CHARACTERISTICS OF ACCESS LINES." A characterization of one block of memory cells might be deemed to be representative of other blocks of memory cells in a same, or different memory. For example, the resistance value for an access line of one block of memory cells at a particular position within that block of memory cells might be deemed to be the resistance value for an access line of one or more other blocks of memory cells, in the same or different memory, at the same position within their respective blocks of memory cells. Similarly, the resistance value for an access line of one block of memory cells at a particular position within that block of memory cells might be deemed to be the resistance value for other access lines at different positions within that block of memory cells, e.g., a contiguous subset of access lines including the access line at the particular position.

The line 550 might represent the resistance values of the access lines as a function of the access line position, with access line 0 being at one end of a string of series-connected memory cells, and access line N being at the other end. It has been found that resistance values of access lines nearer the common-source end of a string of series-connected memory cells are typically lower than resistance values of access lines nearer the data-line end of the string of series-connected memory cells. The resistance values of the access lines might fall into one of a number of ranges of resistance values 552, e.g., ranges $552_0$ to $552_2$. Each range 552 might have a representative resistance value. Each representative resistance value might be a lower (e.g., lowest) value of its corresponding range 552 of resistance values, an upper (e.g., highest) value of its corresponding range 552 of resistance values, an average of its corresponding range 552 of resistance values, or some other value from the lower value to the upper value of its corresponding range 552 of resistance value. As used herein, an average will refer to any measure of central tendency of a data set, e.g., a mean, a median and/or a mode of that data set. For some embodiments, a resistance value of an access line for the foregoing timing parameter equations might be deemed to be equal to the representative resistance value of the range 552 in which the plotted resistance value of that access line resides. However, where individual resistance values are determined, they could alternatively be used. The particular resistance value Rdes might be deemed to equal the representative resistance value of a lowest range $552_0$.

The point 554 might represent a transition between range $552_0$ and range $552_1$, and the point 556 might represent a transition between range $552_1$ and range $552_2$. For example, a grouping of access lines 0 to α might each have a resistance value in the range $552_0$, a grouping of access lines α+1 to β might each have a resistance value in the range $552_1$, and a grouping of access lines β+1 to N might each have a resistance value in the range $552_2$. Fewer or additional ranges of resistance values 552 might be used. The representative resistance value of each of the ranges 552 might be used in determining desired timing parameters for each access line of its corresponding grouping of access lines.

For some embodiments, the representative capacitance value of an access line might be deemed to be the same for each of the access lines of a block of memory cells, and might be determined experimentally, empirically or through simulation. For other embodiments, a representative capacitance value for each access line or subsets of access lines could be determined in like manner to the representative resistance values.

Various embodiments might adjust timing parameters such that access lines near one end of a NAND string might have shorter timing characteristics, e.g., due to typically having lower resistance characteristics, than access lines nearer the other end of the NAND string, e.g., due to typically having higher resistance characteristics. Each access line within a range 552 of resistance values might utilize the same timing parameters, e.g., the same values of $t_{RISE}$, $t_{FLAT}$, and/or $t_{FALL}$.

It is noted that where the value of $t_{FLAT}$ is insufficient for the far end of an access line to reach its target voltage level quickly enough for a given programming pulse, memory cells at the near end of the access line might be expected to program at a faster rate than memory cells at the far end of the access line. In such a situation, for any given programming pulse, there may be more memory cells failing a verify operation at the far end of the access line than memory cells failing the verify operation at the near end of the access line, e.g., failing to reach a threshold voltage level corresponding to a desired data state following a programming pulse.

It is common to utilize data randomization techniques during programming of memory cells Data randomization changes original data to encoded data, during a programming operation, such that it is stored in a pattern that is different than a pattern in which the original data would have been stored, and restores the encoded data to the original data during a read operation. In general, some function may be used to encode the original data, and the inverse of that function might be used to decode the encoded data to restore the original data. While generally referred to as a data randomizer in the art, it is recognized that the data is not truly randomized in a mathematical sense. Instead, randomization as used herein refers to a redistribution of data values in a reversible manner. Data randomization is often used to mitigate coupling effects between closely neighboring memory cells that can disturb the intended data states. With a sufficient sample size, e.g., 128 memory cells for TLC memory cells, data randomization might approximate representation of equal numbers of each possible data state within each sample. As such, the information regarding verify failures can thus be used to determine whether the value of $t_{FLAT}$ should be increased (e.g., further increased) for a subsequent programming pulse, or for a same programming pulse of a subsequent programming operation. Adjustments made to the value of $t_{FLAT}$ might also inform decisions on desired adjustment of the timing parameters $t_{FALL}$, and optionally $t_{RISE}$.

Figure 6A:
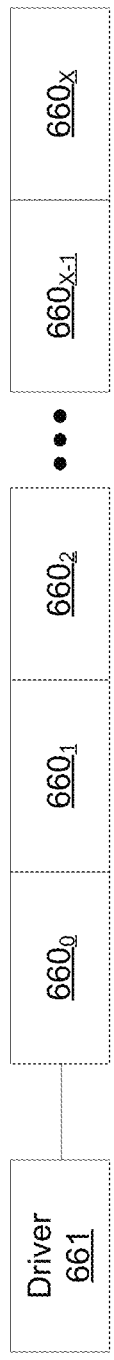
FIG. 6A is a representation of a number of groupings of memory cells connected to a driver for providing voltage levels applied to an access line connected to each of the memory cells of the groupings of memory cells in accordance with embodiments.

FIG. 6A is a representation of a number of groupings of memory cells 660, e.g., groupings $660_0$ to $660_X$, connected to a driver 661, e.g., a voltage generation system for providing voltage levels applied to an access line connected to each of the memory cells of the groupings of memory cells 660. Each grouping of memory cells 660 might represent a subset of the memory cells selected for a sense (e.g., verify) operation, of a logical page of memory cells, from end of an access line (e.g., near end) nearest the driver 661, e.g., corresponding to the grouping of memory cells $660_0$, to an end of the access line (e.g., far end) farthest from the driver 661, e.g., corresponding to the grouping of memory cells $660_X$. Each grouping of memory cells 660 might contain a same number of memory cells, or they might contain differing numbers of memory cells. A number of groupings of memory cells 660 might be two or more. While a number of groupings of memory cells 660 as small as two could provide information regarding whether memory cells at the far end of the access line were programming at a similar rate to the programming rate of memory cells at the near end of the access line, higher numbers of groupings of memory cells 660 might provide additional information regarding the magnitude of the adjustment desired to obtain a desired result.

Figure 6B:
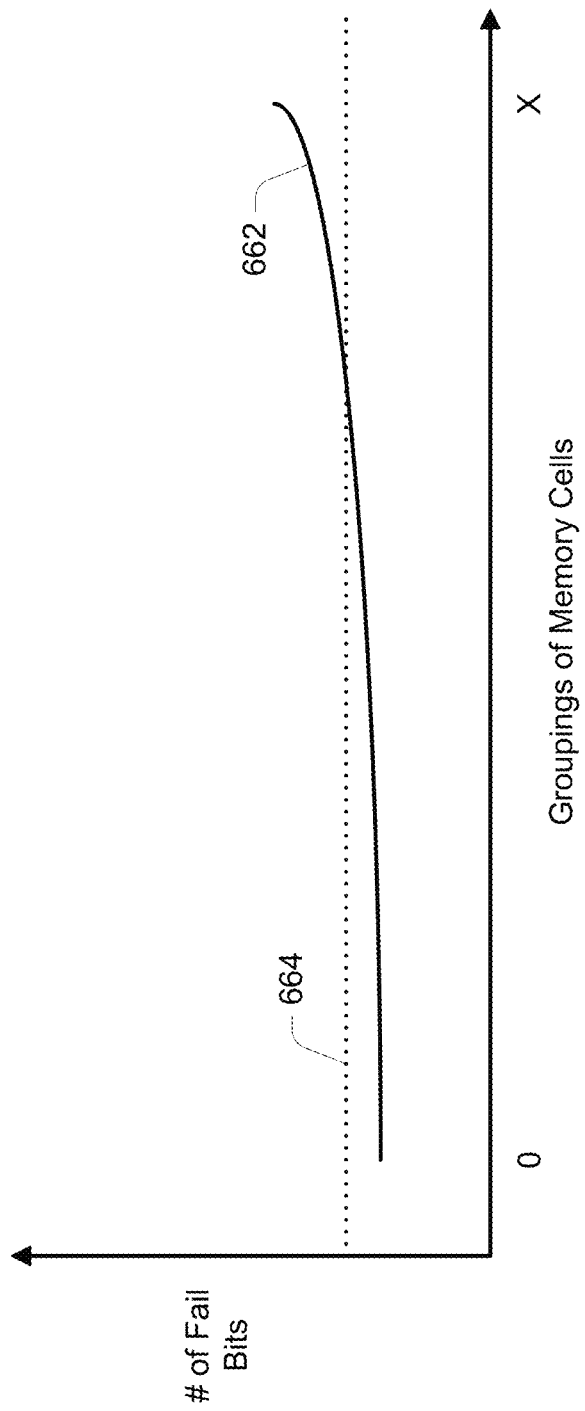
FIG. 6B conceptually depicts a number of memory cells failing a verify operation for each grouping of memory cells of FIG. 6A in accordance with embodiments.

FIG. 6B conceptually depicts a number of memory cells failing a verify operation, e.g., a number of fail bits, for each grouping of memory cells 660 for a situation where the target voltage level is not applied long enough to effectively program memory cells at the far end of the access line to a same (e.g., similar) degree as those memory cells at the near end of the access line. The number of fail bits might be expressed as an integer value, e.g., a number of memory cells of a grouping of memory cells failing the verify operation, or it might be expressed as a ratio, e.g., a fraction or a percentage of a total number of memory cells of a grouping of memory cells that failed the verify operation. Where the groupings of memory cells 660 each contain a same number of memory cells, the number of fail bits might be expressed either as an integer value or as a ratio. Where the groupings of memory cells 660 contain differing numbers of memory cells, expression as a ratio might provide more meaningful information.

In FIG. 6B, the trace 662 might represent a plot of the number of fail bits, while the line 664 might represent a threshold value. For example, the threshold value might be some number of fail bits greater than a number of fail bits for the grouping of memory cells $660_0$. Where groupings of memory cells 660 have a number of fail bits higher than the threshold 664, an adjustment might be indicated. The value of the threshold 664 might be selected to be greater than the number of fail bits of the grouping of memory cells $660_0$ to reduce the risk of unwarranted adjustments as a result of normal statistical variation. Note that an expected number of fail bits might change during a programming operation, and might be expected to decrease as programming pulses of increasing voltage levels are applied and more memory cells reach their desired data state. As such, the magnitude of the threshold 664 might also be expected to change for each verify operation. For example, the threshold 664 might have a value that is 10% higher than the number of fail bits of the grouping of memory cells $660_0$. However, the relative differences between the number of fail bits of the grouping of memory cells $660_0$, and the numbers of fail bits of groupings of memory cells 660 farther away from the driver 661, might still be a useful guide to determining whether to adjust this timing parameter.

Figure 7:
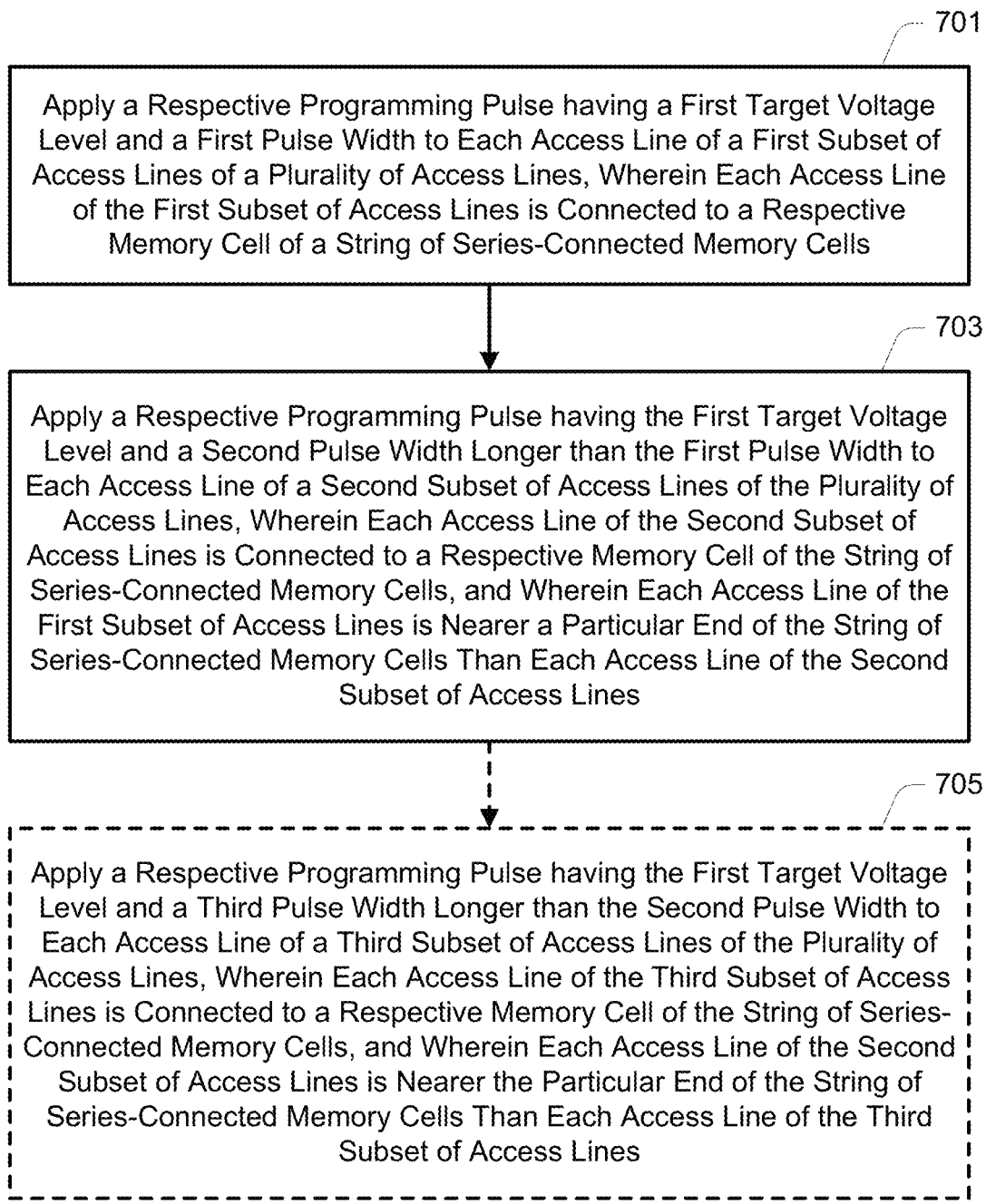
FIG. 7 depicts a flowchart of a method of operating a memory according to an embodiment during a number of programming operations.

FIG. 7 depicts a flowchart of a method of operating a memory according to an embodiment, e.g., during a number of programming operations. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 701, a respective programming pulse having a first target voltage level and a first pulse width might be applied to each access line of a first subset of access lines of a plurality of access lines. For example, memory cells of a string of series-connected memory cells are typically programmed from one end of the string, e.g., an end selectively connected to a common source, to the other end of the string, e.g., an end selectively connected to a data line, in succession. As such, the respective programming pulses having the first target voltage level and the first pulse width might each represent a programming pulse, e.g., an Xth programming pulse, on a respective access line of the first subset of access lines for a plurality of programming operations, each for programming a respective memory cell of one or more strings of series-connected memory cells. Each programming operation of the plurality of programming operations might have Y, e.g., a maximum of Y, programming pulses, where X is an integer value greater than or equal to one, and Y is an integer value greater than X.

Pulse width might represent a length of time from application of a programming pulse to an access line to an initiation of discharge of that programming pulse, e.g., $t_{RISE}+t_{FLAT}$. The first subset of access lines might represent a contiguous grouping of two or more access lines. For example, where the plurality of access lines contains N+1 access lines, such as in FIG. 5, the first subset of access lines might include each access line from access line $202_0$ to access line $202_\alpha$, where α is greater than zero and less than N.

At 703, a respective programming pulse having the first target voltage level and a second pulse width longer than the first pulse width might be applied to each access line of a second subset of access lines of the plurality of access lines. The respective programming pulses having the first target voltage level and the second pulse width might each represent a programming pulse, e.g., the Xth programming pulse, on a respective access line of the second subset of access lines for the plurality of programming operations.

The second subset of access lines might represent a contiguous grouping of two or more access lines. Continuing with the foregoing example, the second subset of access lines might include each access line from access line $202_{\alpha+1}$ to access line $202_\beta$, where β is less than N.

The foregoing process could be repeated for one or more additional contiguous groupings of access lines. For example, at 705, a respective programming pulse having the first target voltage level and a third pulse width longer than the second pulse width might be applied to each access line of a third subset of access lines of the plurality of access lines. The respective programming pulses having the first target voltage level and the third pulse width might each represent a programming pulse, e.g., the Xth programming pulse, on a respective access line of the third subset of access lines for the plurality of programming operations.

The third subset of access lines might represent a contiguous grouping of two or more access lines. Continuing with the foregoing example, the third subset of access lines might include each access line from access line $202_{\beta+1}$ to access line $202_N$. Although three subsets of access lines are described with reference to FIG. 7, fewer or more subsets of access lines, corresponding to other mutually-exclusive ranges of resistance values, might be used. Where additional subsets of access lines are involved, a union of the first subset of access lines, the second subset of access lines and the third subset of access lines might contain fewer than all access lines of a block of memory cells.

The method of FIG. 7 might be repeated for additional programming pulses of respective programming operations on each access line of the plurality of access lines. Pulse widths for each programming pulse applied to the second subset of access lines might be longer than pulse widths for each corresponding programming pulse (e.g., having a same target voltage level) applied to the first subset of access lines, pulse widths for each programming pulse applied to the third subset of access lines might be longer than pulse widths for each corresponding programming pulse (e.g., having a same target voltage level) applied to the second subset of access lines, and so on.

As previously described, the various pulse widths might be dependent upon the target voltage level and the resistance characteristics of the subsets of access lines. As one example, the timing parameters corresponding to a pulse width might be selected from a lookup table. Table 1 is one example of a lookup table that might be used with embodiments. Table 1 depicts only two target voltage level, e.g., V1, which might be an target voltage level for an initial programming pulse of a programming operation, and V2, which might be a target voltage level for a subsequent (e.g., higher) programming pulse of the programming operation. While Table 1 depicts only two target voltage levels, additional (e.g., successively higher) target voltage levels could be added using the same guidance. In addition, where the RC characteristics of the first subset of memory cells are equal to the particular RC characteristics, e.g., Rdes*Cdes, the multiplier $B_{RC(First)}$ might equal one.

TABLE 1

| Target Voltage Level | Subset of Memory Cells | $t_{RISE}$ | $t_{FLAT}$ | $t_{FALL}$ |
|---|---|---|---|---|
| V1 | First | $t_{RISE(init)}$ | $t_{FLAT(init)} * B_{RC(First)}$ | $t_{FALL(init)}$ |
|  | Second | $t_{RISE(init)}$ | $t_{FLAT(init)} * B_{RC(Second)}$ | $t_{FALL(init)}$ |
|  | Third | $t_{RISE(init)}$ | $t_{FLAT(init)} * B_{RC(Third)}$ | $t_{FALL(init)}$ |
| V2 | First | $Q_{RISE(V2)} * t_{RISE(init)}$ | $Q_{FLAT(V2)} * t_{FLAT(init)} * B_{RC(First)}$ | $Q_{fALL(V2)} * t_{FALL(init)}$ |
|  | Second | $Q_{RISE(V2)} * t_{RISE(init)}$ | $Q_{FLAT(V2)} * t_{FLAT(init)} * B_{RC(Second)}$ | $Q_{fALL(V2)} * t_{FALL(init)} * C_{RC(Second)}$ |
|  | Third | $Q_{RISE(V2)} * t_{RISE(init)}$ | $Q_{FLAT(V2)} * t_{FLAT(init)} * B_{RC(Third)} + Y_{Vtarget(V2)}$ | $Q_{fALL(V2)} * t_{FALL(init)} * C_{RC(Third)}$ |

Assigning desired timing parameters for each target voltage level of a programming operation and for contiguous subsets of memory cells as described with reference to FIG. 7 might simplify control schemes providing for adjustment of timing parameters in response to RC characteristics of different access lines.

Figure 8:
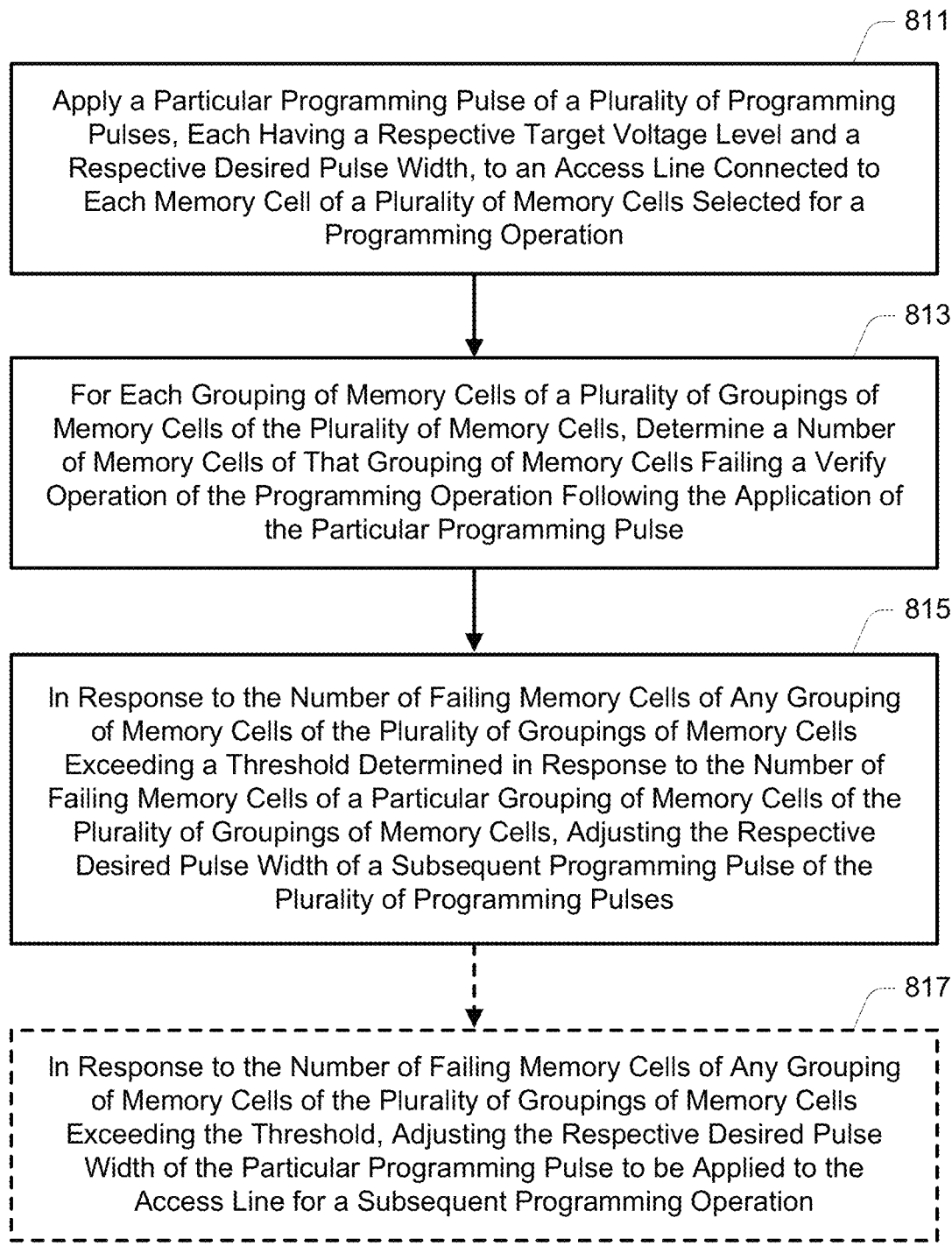
FIG. 8 depicts a flowchart of a method of operating a memory according to an embodiment during one or more programming operations.

FIG. 8 depicts a flowchart of a method of operating a memory according to an embodiment, e.g., during one or more programming operations. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 811, a particular programming pulse of a plurality of programming pulses each having a respective target voltage level and a respective desired pulse width might be applied to an access line connected to each memory cell of a plurality of memory cells selected for a programming operation.

At 813, e.g., following application of the particular programming pulse having its respective target voltage level and respective pulse width, a number of memory cells failing a verify operation of the programming operation might be determined for each grouping of memory cells of a plurality of groupings of memory cells of the plurality of memory cells. The number of memory cells failing the verify operation might be expressed as an integer value or as a ratio. Each grouping of memory cells might have a same number of memory cells. Alternatively, the groupings of memory cells might contain differing numbers of memory cells. For some embodiments, the plurality of groupings of memory cells might include each memory cells of the plurality of memory cells. For other embodiments, the plurality of groupings of memory cells might include fewer than all memory cells of the plurality of memory cells. For example, the number of memory cells failing a verify operation might be determined only for a grouping of memory cells nearest the driver applying the particular programming pulse to the access line, and a grouping of memory cells farthest from the driver applying the particular programming pulse to the access line. With reference to FIG. 6A, this might include the grouping of memory cells $660_0$ and the grouping of memory cells $660_X$.

At 815, in response to the number of failing memory cells of any grouping of memory cells of the plurality of grouping of memory cells exceeding a threshold determined in response to the number of failing memory cells (e.g., failing bits) of a particular grouping of memory cells, the respective desired pulse width of a subsequent programming pulse of the plurality of programming pulses might be adjusted, e.g., increased. Such an increase might include increasing one or more of the timing parameters $t_{RISE}$ and $t_{FLAT}$ for the subsequent programming pulse. For some embodiments, such an increase might include increasing the timing parameter $t_{FLAT}$ for the subsequent programming pulse, without increasing the timing parameter $t_{RISE}$.

Optionally, at 817, in response to the number of failing memory cells of any grouping of memory cells exceeding the threshold, the respective desired pulse width of the particular programming pulse to be applied to the access line for a subsequent programming operation might be adjusted in addition, or in the alternative.

Although the timing parameter $t_{FLAT}$ might not have an expected effect on a rate of programming memory cells, an indication that the pulse width should be increased might further indicated that the timing parameter $t_{FLAT}$ might also warrant an increase in order to provide sufficient time to discharge the access line.

It is noted that the method of FIG. 8 could be used in conjunction with the method of FIG. 7. For example, where a timing adjustment is indicated in the method of FIG. 8, a lookup table or calculation used to determine the pulse widths in the method of FIG. 7 for any of the access lines of the plurality of access lines could be adjusted for subsequent programming pulses on those access lines, or for subsequent programming operations on those access lines.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:
1. A memory, comprising:
   an array of memory cells comprising a plurality of strings of series-connected memory cells;
   a plurality of access lines, wherein each access line of the plurality of access lines is connected to a respective plurality of memory cells of the array of memory cells; and a controller for access of the array of memory cells, wherein the controller is configured to cause the memory to:

apply a respective programming pulse having a first target voltage level and a first pulse width to each access line of a first subset of access lines of the plurality of access lines during programming of the respective pluralities of memory cells for each access line of the plurality of access lines, wherein each access line of the first subset of access lines is connected to a respective memory cell of a string of series-connected memory cells of the plurality of strings of series-connected memory cells; and apply a respective programming pulse having the first target voltage level and a second pulse width longer than the first pulse width to each access line of a second subset of access lines of the plurality of access lines during the programming of the respective pluralities of memory cells for each access line of the plurality of access lines, wherein each access line of the second subset of access lines is connected to a respective memory cell of the string of series-connected memory cells, and wherein each access line of the first subset of access lines is nearer a particular end of the string of series-connected memory cells than each access line of the second subset of access lines.

2. The memory of claim 1, wherein the first pulse width and the second pulse width each correspond to a respective first timing parameter $t_{RISE}$ and a respective second timing parameter $t_{FLAT}$, and wherein the respective second timing parameter $t_{FLAT}$ of the second pulse width is greater than the respective second timing parameter $t_{FLAT}$ of the first pulse width.

3. The memory of claim 2, wherein the respective first timing parameter $t_{RISE}$ of the second pulse width is equal to the respective first timing parameter $t_{RISE}$ of the first pulse width.

4. The memory of claim 1, wherein the particular end of the string of series-connected memory cells is an end of the string of series-connected memory cells selectively connected to a common source of the plurality of strings of series-connected memory cells.

5. The memory of claim 1, wherein the respective programming pulse for each access line of the plurality of access lines is a respective first programming pulse of a respective programming operation for its respective access line, and wherein the controller is further configured to cause the memory to:

apply a respective second programming pulse having a second target voltage level higher than the first target voltage level and a third pulse width longer than the first pulse width to each access line of the first subset of access lines of the plurality of access lines during the programming of the respective pluralities of memory cells for each access line of the plurality of access lines; and apply a respective second programming pulse having the second target voltage level and a fourth pulse width longer than the third pulse width and longer than the second pulse width to each access line of the second subset of access lines of the plurality of access lines during the programming of the respective pluralities of memory cells for each access line of the plurality of access lines.

6. A memory, comprising:
an array of memory cells comprising a plurality of strings of series-connected memory cells;
a plurality of access lines, wherein each access line of the plurality of access lines is connected to a respective plurality of memory cells of the array of memory cells; and
a controller for access of the array of memory cells, wherein the controller is configured to cause the memory to:

apply a respective programming pulse having a first target voltage level and a first pulse width to each access line of a first subset of access lines of the plurality of access lines, wherein each access line of the first subset of access lines is connected to a respective memory cell of a string of series-connected memory cells of the plurality of strings of series-connected memory cells;

apply a respective programming pulse having the first target voltage level and a second pulse width longer than the first pulse width to each access line of a second subset of access lines of the plurality of access lines, wherein each access line of the second subset of access lines is connected to a respective memory cell of the suing of series-connected memory cells, and wherein each access line of the first subset of access lines is nearer a particular end of the string of series-connected memory cells than each access line of the second subset of access lines; and apply a respective programming pulse having the first target voltage level and a third pulse width longer than the second pulse width to each access line of a third subset of access lines of the plurality of access lines, wherein each access line of the third subset of access lines is connected to a respective memory cell of the string of series-connected memory cells, and wherein each access line of the second subset of access lines is nearer the particular end of the string of series-connected memory cells than each access line of the third subset of access lines.

7. The memory of claim 6, wherein a union of the first subset of access lines, the second subset of access lines and the third subset of access lines contains each access line of the plurality of access lines.

8. The memory of claim 6, wherein the controller is further configured to cause the memory to apply a respective programming pulse having the first target voltage level and a fourth pulse width longer than the third pulse width to each access line of a fourth subset of access lines of the plurality of access lines, wherein each access line of the fourth subset of access lines is connected to a respective memory cell of the string of series-connected memory cells, and wherein each access line of the third subset of access lines is nearer the particular end of the string of series-connected memory cells than each access line of the fourth subset of access lines.

9. The memory of claim 8, wherein the first pulse width, the second pulse width, the third pulse width and the fourth pulse width each correspond to a respective first timing parameter $t_{RISE}$ and a respective second timing parameter $t_{FLAT}$, and wherein the respective second timing parameter $t_{FLAT}$ of the second pulse width is greater than the respective second timing parameter $t_{FLAT}$ of the first pulse width, the respective second timing parameter $t_{FLAT}$ of the third pulse width is greater than the respective second timing parameter $t_{FLAT}$ of the second pulse width, and the respective second timing parameter $t_{FLAT}$ of the fourth pulse width is greater than the respective second timing parameter $t_{FLAT}$ of the third pulse width.

10. The memory of claim 6, wherein the first pulse width, the second pulse width, and the third pulse width each correspond to a respective first timing parameter tRISE and a respective second timing parameter tFLAT, and wherein the respective second timing parameter tFLAT of the second pulse width is greater than the respective second timing parameter tFLAT of the first pulse width, and the respective second timing parameter tFLAT of the third pulse width is greater than the respective second timing parameter tFLAT of the second pulse width.

11. The memory of claim 10, wherein the respective first timing parameter $t_{RISE}$ of the first pulse width is equal to the respective first timing parameter $t_{RISE}$ of the second pulse width and equal to the respective first timing parameter $t_{RISE}$ of the third pulse width.

12. The memory of claim 6, wherein the particular end of the string of series-connected memory cells is an end of the string of series-connected memory cells selectively connected to a common source of the plurality of strings of series-connected memory cells.

13. A memory, comprising:
an array of memory cells comprising a plurality of strings of series-connected memory cells;
a plurality of access lines, wherein each access line of the plurality of access lines is connected to a respective plurality of memory cells of the array of memory cells; and
a controller for access of the array of memory cells, wherein the controller is configured to cause the memory to:
apply a respective first programming pulse having a first target voltage level and a first pulse width to each access line of a first subset of access lines of the plurality of access lines during programming of the respective pluralities of memory cells for each access line of the plurality of access lines, wherein each access line of the first subset of access lines is connected to a respective memory cell of a string of series-connected memory cells of the plurality of strings of series-connected memory cells, and wherein the respective first programming pulse for each access line of the first subset of access lines is a particular programming pulse of a respective plurality of programming pulses of a respective programming operation on that access line of the first subset of access lines;
for an access line of the first subset of access lines:
determine a first number of memory cells of a particular grouping of memory cells of the respective plurality of memory cells of that access line that fail a verify operation after application of the respective first programming pulse to that access line;
determine a second number of memory cells of a different grouping of memory cells of the respective plurality of memory cells of that access line that fail the verify operation after application of the respective first programming pulse to that access line;
determine a first threshold in response to the first number of memory cells that is greater than or equal to the first number of memory cells; and
in response to the second number of memory cells exceeding the first threshold, adjust a pulse width of a respective second programming pulse of its respective plurality of programming pulses to be applied to each access line of the first subset of access lines for its respective programming operation;
apply a respective first programming pulse having the first target voltage level and a second pulse width longer than the first pulse width to each access line of a second subset of access lines of the plurality of access lines during the programming of the respective pluralities of memory cells for each access line of the plurality of access lines, wherein each access line of the second subset of access lines is connected to a respective memory cell of the string of series-connected memory cells, wherein each access line of the first subset of access lines is nearer a particular end of the string of series-connected memory cells than each access line of the second subset of access lines, and wherein the respective first programming pulse for each access line of the second subset of access lines is a particular programming pulse of a respective plurality of programming pulses of a respective programming operation on that access line of the second subset of access lines; and
for an access line of the second subset of access lines:
determine a third number of memory cells of a particular grouping of memory cells of the respective plurality of memory cells of that access line that fail a verify operation after application of the respective first programming pulse to that access line;
determine a fourth number of memory cells of a different grouping of memory cells of the respective plurality of memory cells of that access line that fail the verify operation after application of the respective first programming pulse to that access line;
determine a second threshold in response to the third number of memory cells that is greater than or equal to the third number of memory cells; and
in response to the fourth number of memory cells exceeding the second threshold, adjust a pulse width of a respective second programming pulse of its respective plurality of programming pulses to be applied to each access line of the second subset of access lines for its respective programming operation.

14. The memory of claim 13, wherein, for each access line of the first subset of access lines and the second subset of access lines, the particular programming pulse of the respective plurality of programming pulses of the respective programming operation on that access line is a programming pulse of its respective plurality of programming pulses other than an initial programming pulse of its respective plurality of programming pulses.

15. The memory of claim 14, wherein, for each access line of the first subset of access lines and the second subset of access lines, the second programming pulse of its respective plurality of programming pulses is a programming pulse of its respective plurality of programming pulses immediately following the first programming pulse of its respective plurality of programming pulses.

16. The memory of claim 13, wherein the controller being configured to adjust a pulse width of a respective second programming pulse of a respective plurality of programming pulses to be applied to an access line comprises the controller being configured to adjust a respective pulse width of each programming pulse of that respective plurality of programming pulses subsequent to the first programming pulse of that respective plurality of programming pulses.

17. A memory, comprising:
   a plurality of data lines;
   a common source;
   an array of memory cells comprising a plurality of strings of series-connected memory cells, wherein each string of series-connected memory cells of the plurality of strings of series-connected memory cells has a respective first end selectively connected to the common source and a respective second end selectively connected to a respective data line of the plurality of data lines;
   a plurality of access lines, wherein each access line of the plurality of access lines is connected to a respective plurality of memory cells of the plurality of strings of series-connected memory cells of the array of memory cells; and
   a controller for access of the array of memory cells, wherein the controller is configured, during programming of the respective pluralities of memory cells for each access line of the plurality of access lines in a direction from the common source to the data line, to cause the memory to:
      apply a respective programming pulse having a first target voltage level and a first pulse width to each access line of a first subset of access lines of the plurality of access lines, wherein each access line of the first subset of access lines is connected to a respective memory cell of a string of series-connected memory cells of the plurality of strings of series-connected memory cells; and
      apply a respective programming pulse having the first target voltage level and a second pulse width longer than the first pulse width to each access line of a second subset of access lines of the plurality of access lines, wherein each access line of the second subset of access lines is connected to a respective memory cell of the string of series-connected memory cells, and wherein each access line of the first subset of access lines is nearer the respective first end of each string of series-connected memory cells of the plurality of strings of series-connected memory cells than each access line of the second subset of access lines.

18. The memory of claim 17, wherein each respective programming pulse for each access line of the first subset of access lines is a respective first programming pulse for each access line of the first subset of access lines, wherein the respective first programming pulse for each access line of the first subset of access lines is an Xth programming pulse of a respective plurality of programming pulses of a respective programming operation on that access line of the first subset of access lines, wherein each respective programming pulse for each access line of the second subset of access lines is a respective first programming pulse for each access line of the second subset of access lines, wherein the respective first programming pulse for each access line of the second subset of access lines is an Xth programming pulse of a respective plurality of programming pulses of a respective programming operation on that access line of the second subset of access lines, and wherein X is an integer value greater than or equal to one.

19. The memory of claim 18, wherein the controller is further configured, during the programming of the respective pluralities of memory cells for each access line of the plurality of access lines in a direction from the common source to the data line, to cause the memory to:
   for an access line of the first subset of access lines:
      determine a first number of memory cells of a particular grouping of memory cells of the respective plurality of memory cells of that access line that fail a verify operation after application of the respective first programming pulse to that access line;
      determine a second number of memory cells of a different grouping of memory cells of the respective plurality of memory cells of that access line that fail the verify operation after application of the respective first programming pulse to that access line;
      determine a first threshold in response to the first number of memory cells that is greater than or equal to the first number of memory cells; and
      in response to the second number of memory cells exceeding the first threshold, increase a pulse width of a respective (X+1)th programming pulse of its respective plurality of programming pulses to be applied to each access line of the first subset of access lines for its respective programming operation.

20. The memory of claim 19, wherein the controller is further configured, during the programming of the respective pluralities of memory cells for each access line of the plurality of access lines in a direction from the common source to the data line, to cause the memory to:
   for an access line of the second subset of access lines:
      determine a third number of memory cells of a particular grouping of memory cells of the respective plurality of memory cells of that access line that fail a verify operation after application of the respective first programming pulse to that access line;
      determine a fourth number of memory cells of a different grouping of memory cells of the respective plurality of memory cells of that access line that fail the verify operation after application of the respective first programming pulse to that access line;
      determine a second threshold in response to the third number of memory cells that is greater than or equal to the third number of memory cells; and
      in response to the fourth number of memory cells exceeding the second threshold, increase a pulse width of a respective (X+1)th programming pulse of its respective plurality of programming pulses to be applied to each access line of the second subset of access lines for its respective programming operation.

* * * * *